US006831870B2

(12) United States Patent
Koga

(10) Patent No.: US 6,831,870 B2
(45) Date of Patent: Dec. 14, 2004

(54) SEMICONDUCTOR MEMORY

(75) Inventor: Toru Koga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/628,469

(22) Filed: Jul. 29, 2003

(65) Prior Publication Data

US 2004/0114442 A1 Jun. 17, 2004

(30) Foreign Application Priority Data

Aug. 29, 2002 (JP) ....................................... 2002-251851

(51) Int. Cl.[7] ............................ G11C 29/00; G11C 7/00

(52) U.S. Cl. .................................. 365/200; 365/230.03

(58) Field of Search ....................... 365/185.11, 189.03, 365/200, 230.03

(56) References Cited

U.S. PATENT DOCUMENTS 4,656,610 A 4/1987 Yoshida et al.
5,018,101 A 5/1991 Kajigaya et al.
5,134,584 A * 7/1992 Boler et al. ................. 365/200
5,920,503 A * 7/1999 Lee et al. .............. 365/185.11
6,201,744 B1 * 3/2001 Takahashi ................... 365/200
6,337,818 B1 * 1/2002 Morishima .................. 365/200

FOREIGN PATENT DOCUMENTS

EP 0 401 792 12/1990
JP 2000-182390 6/2000

* cited by examiner

*Primary Examiner*—Van Thu Nguyen
(74) *Attorney, Agent, or Firm*—Staas & Halsey LLP

(57) ABSTRACT

Main memory units are each composed of an even number of sub memory units having different addresses. The sub memory units have memory cells, bit lines corresponding to different data terminals with numbers, sense amplifiers, and column switch circuits for connecting the bit lines to data bus lines. Column switch areas of the main memory units are formed in mirror symmetry. Consequently, the sequence of the data terminal numbers of the bit lines in the case of relief where a redundancy memory unit is used can be easily made the same as in the case of non-relief where the redundancy memory unit is not used. As a result, at the time of defect analysis, the sequence of the bit lines need not be taken into account regardless of whether the product is a relief product or non-relief product. This allows a reduction in the time necessary for defect analysis.

8 Claims, 6 Drawing Sheets memory cell array 22
column decoder CDEC
defect information memory part 14
RINF
redundancy switch part RSW
/CE
/OE
/WE
command decoder 10
timing control circuit 16
SU SU SU SU SU SU SU
ADD
address input circuit 12
address decoder 18
RU MU MU MU
ADEC
CDB
DQ (DQ0-7)
data input/ output circuit 20

SEMICONDUCTOR MEMORY

CROSS REFERENCE TO RELATED APPLICATION

This application is based upon and claims the benefit of priority from the prior Japanese Patent Application No. 2002-251851, filed on Aug. 29, 2002, the entire contents of which are incorporated herein by reference.

BACKGROUND OF THE INVENTION

1. Field of the Invention

The present invention relates to a semiconductor memory having a redundancy circuit for relieving a defect occurring in a fabrication process.

2. Description of the Related Art

For the sake of improving a conforming rate, or yield, and reducing chip cost, semiconductor memories such as a DRAM have a redundancy circuit for relieving a defect occurring in a fabrication process. In a testing process, a circuit containing a defect is replaced with the redundancy circuit to relieve the defect.

In the meantime, during the development of semiconductor memories or immediately after the start of mass production thereof, defect analysis is important in improving the yield. Feeding back the result of the defect analysis to the fabrication process can stabilize the yield at an early stage.

In the defect analysis mentioned above, an electric analysis using an LSI tester is initially conducted to identify defective points. Here, when the LSI tester judges memory cells defective, the positions thereof are output as a fail bit map. The fail bit map is extremely useful since the test result from the LSI tester can be seen visually. Then, actual defective points (specific memory cells, sense amplifiers, word lines, decoders, or the like) are identified based on the fail bit map. Subsequently, the defective points are subjected to a physical analysis under a microscope or the like, so that the causes of the defects are identified.

In conventional semiconductor memories having a redundancy circuit, however, correspondence between the bit lines and the numbers of the data terminals might sometimes vary depending on whether or not the circuit containing a defect is replaced with the redundancy circuit. Specifically, there has been a problem that a bit line corresponding to a bit-0 data terminal before the replacement with the redundancy circuit may be associated with a bit-1 data terminal after the replacement with the redundancy circuit.

On this account, it takes a great deal of time to identify defective points during the physical analysis in particular. Consuming a great amount of time for the defect analysis results in delaying the feedback to the fabrication process, which makes the yield stabilization at an early stage difficult.

To solve this problem for smooth physical analysis, two fail bit maps are conventionally created depending on whether or not the redundancy circuit is used. With two fail bit maps, however, the testing and designing time increases and reduces the design efficiency. Besides, using the two fail bit maps for intended purpose is inconvenient.

SUMMARY OF THE INVENTION

It is an object of the present invention to establish uniform correspondence between the bit lines and the numbers of the data terminals regardless of whether or not the redundancy circuit is used, thereby reducing the time necessary for defect analysis.

According to one of the aspects of the semiconductor memory of the present invention, sub memory units each have a plurality of bit lines connected to memory cells, respectively, a plurality of sense amplifiers connected to the bit lines, respectively, and a plurality of column switch circuits for connecting the bit lines to data bus lines, respectively. The bit lines in each sub memory unit correspond to different data terminals. The sub memory units are arranged in a direction orthogonal to a wiring direction of the bit lines.

Main memory units are each composed of an even number of sub memory units having different addresses from each other. A redundancy memory unit has the same configuration as that of the main memory unit. The redundancy memory unit is enabled when a defective sub memory unit out of the sub memory units in the main memory units is disabled. That is, when the semiconductor memory has defects, defect relief is exercised on a sub memory unit basis. In each of the main memory units, column switch areas in which the column switch circuits are arranged are formed in mirror symmetry in the wiring direction of the bit lines.

Arranging the column switch areas in mirror symmetry allows the sequence of the data terminal numbers of the bit lines in the case of relieving a defect, in which the redundancy memory unit is used, to be easily made the same as in the case of not relieving a defect, in which the redundancy memory unit is not used. This eliminates the necessity of taking the sequence of the bit line numbers into account regardless of whether the product is a relief product or non-relief product. This facilitates the defect analysis. It is therefore possible to reduce the time necessary for the defect analysis.

Besides, arranging the column switch areas in mirror symmetry allows a reduction in the layout size of the column switch areas.

According to another aspect of the semiconductor memory of the present invention, in each of the sub memory units, the column switch circuits are arranged in a row in the wiring direction of the bit lines. In adjoining sub memory units within each of the main memory units, the column switch circuits are arranged such that the sequences of their corresponding data terminals' numbers are opposite to each other. Consequently, in two adjoining sub memory units of each main memory unit, the bit lines of one of the sub memory units are successively connected to the column switch circuits aligning in one direction while the bit lines of the other sub memory unit are successively connected to the column switch circuits aligning in the opposite direction. It is therefore possible to put the data terminal numbers of the bit lines in an identical sequence and form the column switch areas in mirror symmetry.

According to another aspect of the semiconductor memory of the present invention, the data bus lines are wired along each row of the column switch circuits aligning in the direction orthogonal to the wiring direction of the bit lines. Wiring the data bus lines for each row of the column switch circuits eliminates the necessity of intricately wiring the data bus lines in curves on the column switch circuits corresponding to the data terminals with the same numbers as that of the data bus lines. This facilitates the wiring layout of the data bus lines. Besides, the wiring area of the local data bus lines can be minimized.

According to another aspect of the semiconductor memory of the present invention, the column switch circuits have first and second transistors each. The drain of the first transistor is connected to any one of the data bus lines. The gate of the same receives a column selecting signal to be selected in accordance with an address. The gate of the second transistor is connected to any one of the bit lines. The drain of the same is electrically connected to a source of the first transistor during a read operation. Being connected at its gate to a bit line, the second transistor has the function of amplifying the voltage of the bit line. This system is commonly referred to as direct sense system. The present invention is also applicable to a semiconductor memory of direct sense system.

According to another aspect of the semiconductor memory of the present invention, the data bus lines transfer read data to be read from the memory cells and write data to be written to the memory cells. The number of data bus lines can be reduced by using the data bus lines for both read and write data. This facilitates the layout design. Besides, the layout area of the data bus lines can be reduced for smaller chip size.

According to another aspect of the semiconductor memory of the present invention, the column switch circuits have first through fourth transistors each. The drain of the first transistor is connected to any one of the data bus lines. The gate of the same receives a column selecting signal to be selected in accordance with an address. The gate of the second transistor is connected to the bit line. The source of the same is connected to a source power supply. The drain of the third transistor is connected to a source of the first transistor. The source of the same is connected to a drain of the second transistor. The gate of the same receives a read control signal which turns to an activation level during a read operation. The drain of the fourth transistor is connected to the bit line. The source of the same is connected to the source of the first transistor. The gate of the same receives a write control signal which turns to an activation level during a write operation.

The second and third transistors to operate during a read operation and the fourth transistor to operate during a write operation are connected in parallel to the first transistor. This can facilitate the sharing of the data bus lines between read data and write data.

According to another aspect of the semiconductor memory of the present invention, first column selecting lines respectively transmit, to the sub memory units, a plurality of column selecting signals to be selected in accordance with the address. Second column selecting lines are formed in the sub memory units of the main memory units and of the redundancy memory unit, respectively, and are connected to the column switch circuits. A defect information memory part stores defect information indicating a defective sub memory unit in the main memory units. A redundancy switch part is switched according to contents stored in the defect information memory part to disconnect the first column selecting lines from the second column selecting line of the defective sub memory unit and to connect the same to the second column selecting lines of the sub memory units operating normally in the main memory units and to the second column selecting line of the sub memory unit in the redundancy memory unit.

For example, when the semiconductor memory has a defect, the redundancy switch part connects the first column selecting lines not to the second column selecting line of the defective sub memory unit but to the adjacent second column selecting lines in succession. The system by which the connections between the first column selecting lines and the second column selecting lines are thus shifted in succession in the presence of a defect is commonly referred to as shift redundancy system. In the shift redundancy system, successively shifting the connections between the column selecting lines might change the sequence of the data terminal numbers of the bit lines depending on the layout of the sub memory units, when the redundancy memory unit is used. This problem can be solved by applying the present invention to the semiconductor memory of shift redundancy system. That is, at the time of defect analysis, the sequence of the bit line numbers need not be taken into account regardless of whether the product is a relief product or non-relief product. This facilitates the defect analysis.

According to another aspect of the semiconductor memory of the present invention, each of the bit lines is either one of bit lines of each of complementary bit line pairs. Each of the data bus lines is either of data bus lines of each of complementary data bus line pairs. The sense amplifiers are shared between the respective bit line pairs. Each of the column switch areas includes the column switch circuits corresponding to the bit line pairs. That is, the present invention can be applied to the bit lines of a semiconductor memory having complementary bit line pairs.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, an embodiment of the present invention will be described with reference to the drawings.

Figure 1:
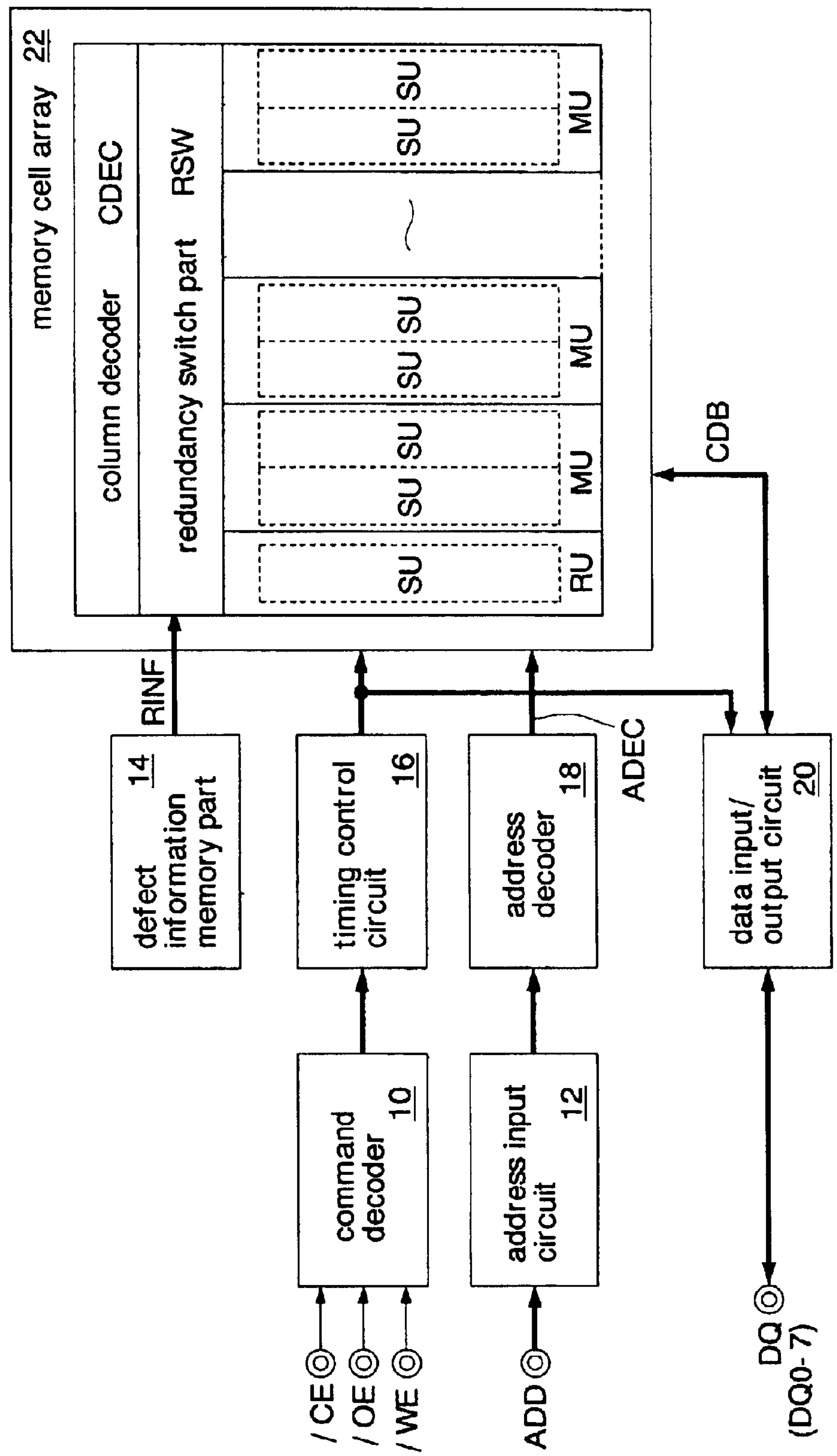
FIG. 1 is a block diagram showing an embodiment of the semiconductor memory of the present invention.

FIG. 1 shows an embodiment of the semiconductor memory of the present invention. In the diagram, each thick line represents a signal line that consists of a plurality of bits. The double circles shown to the left in the diagram represent external terminals.

This semiconductor memory is formed as a pseudo SRAM which has DRAM memory cells and an SRAM interface. The pseudo SRAM has a command decoder 10, an address input circuit 12, a defect information memory part 14, a timing control circuit 16, an address decoder 18, a data input/output circuit 20, and a memory cell array 22. Aside from those shown in the diagram, the pseudo SRAM also has a refresh timer, a refresh address counter, a refresh control circuit, and the like for performing a refresh operation automatically at predetermined intervals. These components will be omitted from the drawings and description since the present invention is not directly related to refresh operations.

The command decoder 10 decodes a chip enable signal /CE, an output enable signal /OEM, and a write enable signal /WE, and outputs the decoding result to the timing control circuit 16.

The address input circuit 12 receives an address signal ADD through an address terminal, and outputs the received address signal ADD to the address decoder 18. The address signal ADD consists of a plurality of bits of row address signal and a plurality of bits of column address signal. In this pseudo SRAM, the row address signal and the column address signal are supplied to the address terminal at the same timing (address non-multiplexing system).

The defect information memory part 14 consists of a plurality of fuse circuits each having a fuse. The fuses of the fuse circuits are programmed based on the result of inspection in a testing process. Specifically, the fuse circuits are formed corresponding to the respective bits of the column address, for example. Then, the fuses of fuse circuits that correspond to "1" bits of the column address covering a defective memory cell are blown. The defect information memory part 14 also has a fuse circuit for indicating the use of a redundancy memory unit RU. The defect information memory part 14 outputs a predetermined redundancy information signal RINF according to the fuse program. So-called column redundancy is effected by the programming of the defect information memory part 14.

Incidentally, the pseudo SRAM actually has a redundancy information memory part and a redundancy circuit in order to relieve a defect corresponding to the row address signal in order to effect so-called row redundancy. The circuits for row redundancy will be omitted from the drawings and description, however, since they are not directly related to the present invention.

The timing control circuit 16 receives a control signal from the command decoder 10, and outputs timing signals for controlling the operation of the memory cell array 22 and the data input/output circuit 20. The address decoder 18 decodes the address signal ADD supplied from the address input circuit 12, and outputs the decoding signal ADEC to the memory cell array 22.

The data input/output circuit 20 outputs, to a data terminal DQ, read data that is transmitted to a common data bus CDB from the memory cell array 22 in a read operation. The data terminal DQ consists of 8 bits (DQ0–7). The data input/output circuit 20 outputs write data that is supplied through the data terminal DQ in a write operation to the memory cell array 22 via the common data bus CDB.

The memory cell array 22 has a column decoder CDEC, a redundancy switch part RSW, a plurality of main memory units MU, and the redundancy memory unit RU. The main memory units MU have two sub memory units SU each. The redundancy memory unit RU has a single sub memory unit SU. Incidentally, the memory cell array 22 has a row decoder, which is omitted from the drawings and description since it is not directly related to the present invention.

Figure 2:
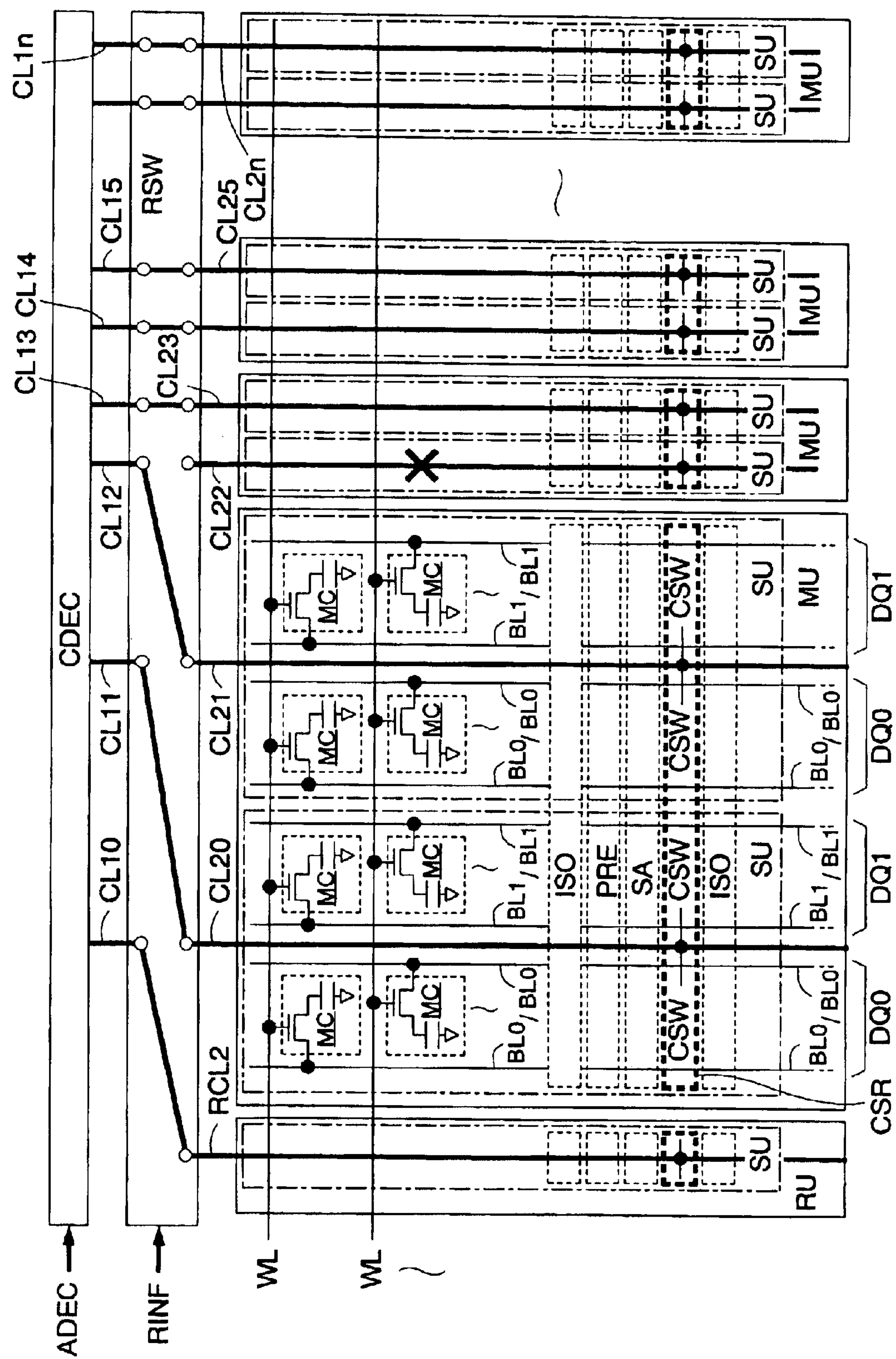
FIG. 2 is a block diagram showing an overview of essential parts of the memory cell array shown in FIG. 1.

FIG. 2 shows essential parts of the memory cell array 22 shown in FIG. 1. Note that in FIG. 2 and subsequent figures, description will be given of circuits corresponding to the data terminals DQ0 and DQ1. Although the pseudo SRAM also has circuits corresponding to the data terminals DQ2–7, these circuits will be omitted from the drawings and description since they are the same circuits as those corresponding to the data terminals DQ0 and DQ1.

The column decoder CDEC outputs a column selecting signal (high level) to any one of first column selecting lines CL1 (CL10, CL11, CL12, CL13, . . . CL1*n*) according to the decoding signal ADEC of the column address signal.

The redundancy switch part RSW has a plurality of switches. The redundancy switch part RSW connects the first column selecting lines CL1 to predetermined second column selecting lines CL2 (CL20, CL21, CL23, . . . CL2*n*, RCL2) according to the redundancy information signal RINF. The second column selecting line RCL2 represents a column selecting line formed in the redundancy memory unit RU.

FIG. 2 shows the case where the left sub memory unit SU in the second main memory unit MU from the left has a defective memory cell MC. Here, the second column selecting line CL22 in the defective main memory unit MU is not connected to the first column selecting line CL12. That is, the individual switches of the redundancy switch part RSW are switched according to the contents (redundancy information signal RINF) stored in the defect information memory part 14 so that the first column selecting lines CL1 are disconnected from the defective second column selecting line CL2 and connected to the second column selecting lines CL2 of the main memory units operating normally and of the redundancy memory unit. The system by which, when the memory cell array 22 has a defect, the first column selecting lines CL1 are switched not to the defective second column selecting line CL2 but to the adjacent second column selecting lines CL2 in succession is commonly referred to as shift redundancy system.

The sub memory units SU are arranged in a direction orthogonal to the wiring direction of bit lines BL and /BL (in the horizontal direction of the diagram). The sub memory units SU (frames in dashed lines) of the main memory units MU and the redundancy memory unit RU each have a bit line pair BL0, BL1 (or /BL0, /BL1) corresponding to the data terminals DQ0, DQ1 and a second column selecting line CL2. That is, each sub memory unit SU has bit lines BL0 and BL1 (or /BL0 and /BL1) which correspond to different data terminals DQ0 and DQ1. The bit line pairs BL, /BL and the second column selecting lines CL2 are laid in the vertical direction in the diagram. The column selecting signals CL1, CL2 are given different addresses from one another. Thus, the sub memory units SU in the main memory units MU and the redundancy memory unit RU are accessed with different addresses.

The bit lines BL and /BL are connected to a plurality of memory cells MC each. The memory cells MC are the same as typical DRAM memory cells, each having a capacitor for retaining data in the form of a charge and a transfer transistor arranged between this capacitor and a bit line BL (or /BL). The gate of the transfer transistor is connected to a word line WL.

The main memory units MU each have a bit line isolation area ISO, a precharge area PRE, a sense amplifier area SA, a column switch area CSR, and a bit line isolation area ISO which are arranged in the wiring direction of the bit lines BL and /BL. The bit lines BL and /BL are connected to each other through switch circuits formed in the bit line isolation areas ISO. The column switch area CSR has column switch circuits CSW which are formed in each sub memory unit SU and connected to bit lines BL0, /BL0, BL1, and /BL1.

Although not shown in particular in the diagram, a plurality of memory cells MC respectively connected to the bit lines BL and /BL are formed below the lower bit line isolation area ISO. The individual circuits of the precharge area PRE, the sense amplifier area SA, and the column switch area CSR are shared between the shown memory cells MC and the not-shown memory cells MC lying below the lower bit line isolation area ISO. Then, according to the row address signal, either one of the bit line isolation areas ISO is blocked to select either ones of the bit lines BL and /BL laid above and below in the diagram.

Figure 3:
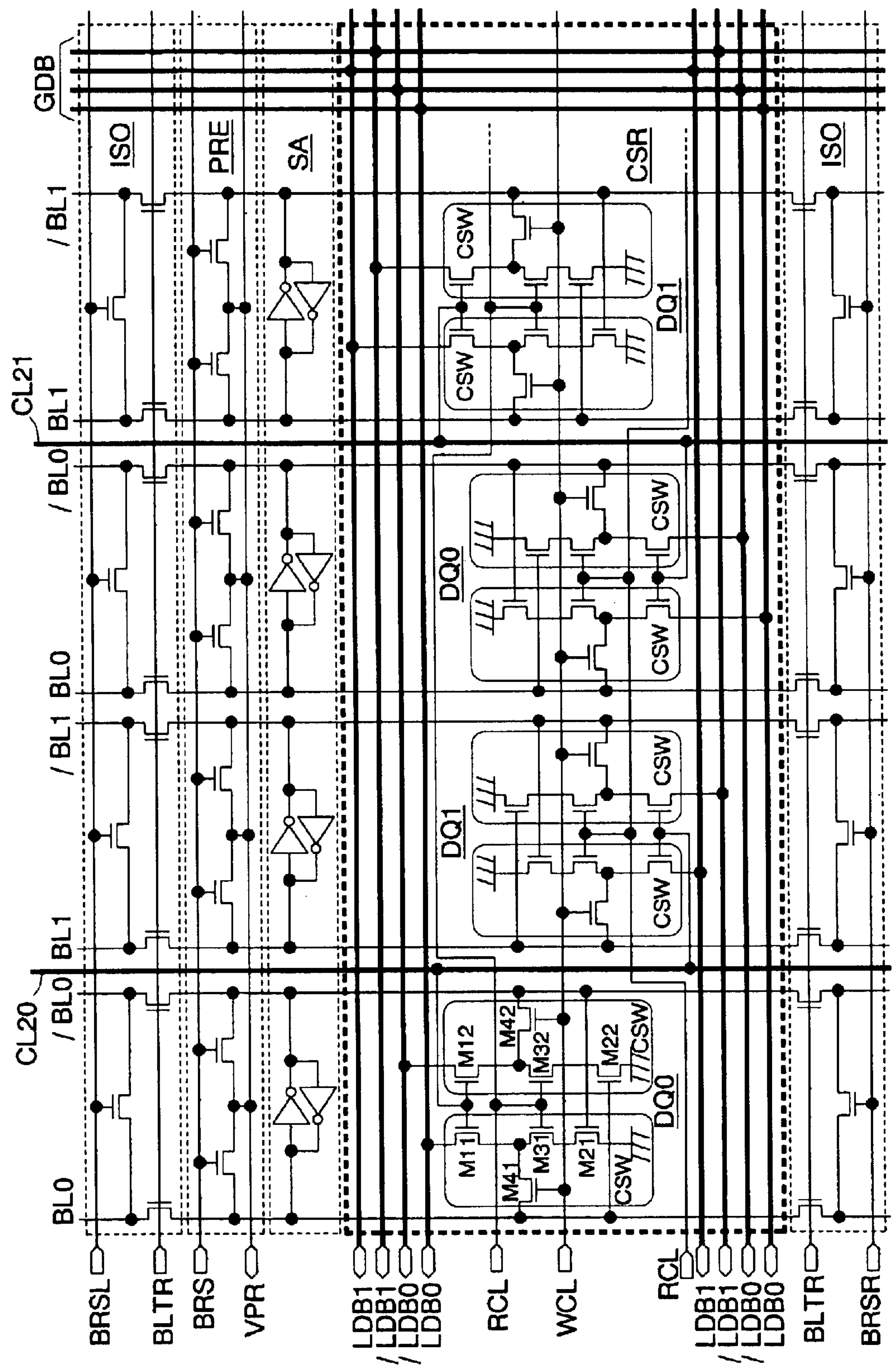
FIG. 3 is a circuit diagram showing the details of a main memory unit of FIG. 2.

FIG. 3 shows the details of the two bit line isolation areas ISO, the precharge area PRE, the sense amplifier area SA, and the column switch area CSR in a main memory unit MU of FIG. 2.

In each of the bit line isolation areas ISO, formed for each of the bit line pairs BL, /BL are an nMOS transistor for equalizing the bit lines BL and /BL according to a bit line reset signal BRSL (or BRSR) and nMOS transistors for respectively connecting the bit lines BL, /BL to sense amplifiers formed in the sense amplifier area SA according to a bit line transfer signal BLTR. In the precharge area PRE, formed for each of the bit line pairs BL, /BL are nMOS transistors for respectively connecting the bit lines BL, /BL to a precharging power supply line VPR according to a bit line reset signal BRS.

In the sense amplifier area SA, a sense amplifier (latch circuit) consisting of two inverters fed back to each other is formed for each of the bit line pairs BL, /BL. The input and output of the sense amplifier are connected to the bit lines BL and /BL, respectively.

In the column switch area CSR, column switch circuits CSW are formed for the respective bit lines BL and /BL. For example, a column switch circuit CSW corresponding to the leftmost bit line BL0 in the diagram has: a first transistor M11 whose drain is connected to a local data bus line LDB0 and whose gate is connected to the second column selecting line CL20 for transmitting the column selecting signal; a second transistor M21 whose gate is connected to the bit line /BL0 and whose source is connected to a ground line (source power supply); a third transistor M31 whose drain is connected to the source of the first transistor M11, whose source is connected to the drain of the second transistor M21, and whose gate receives a read control signal RCL which turns to an activation level in a read operation; and a fourth transistor M41 whose drain is connected to the bit line BL0, whose source is connected to the source of the first transistor M11, and whose gate receives a write control signal WCL which turns to an activation level in a write operation.

Moreover, a column switch circuit CSW corresponding to the left bit line/BL0 in the diagram has: a first transistor M12 whose drain is connected to a local data bus line/LDB0 and whose gate is connected to the second column selecting line CL20 for transmitting the column selecting signal; a second transistor M22 whose gate is connected to the bit line BL0 and whose source is connected to the ground line (source power supply); a third transistor M32 whose drain is connected to the source of the first transistor M12, whose source is connected to the drain of the second transistor M22, and whose gate receives the read control signal RCL which turns to the activation level in a read operation; and a fourth transistor M42 whose drain is connected to the bit line /BL0, whose source is connected to the source of the first transistor M12, and whose gate receives the write control signal WCL which turns to the activation level in a write operation. The column switch circuits CSW of the bit lines BL1, /BL1 and the other bit lines BL0, /BL0 are formed the same as described above.

Being connected to the bit lines /BL and BL at their respective gates, the second transistors M21 and M22 have the function of amplifying the voltages of the bit lines/BL and BL. This system is commonly referred to as direct sense system.

In the column switch area CSR, two local data bus lines LDB (a local data bus line pair LDB0, /LDB0 or LDB1, /LDB1) are formed for each bit line pair BL0, /BL0 (or BL1, /BL1). The local data bus lines LDB transfer read data to be read from the memory cells MC and write data to be written to the memory cells MC. That is, the local data bus lines LDB are bus lines commonly used for read and write operations. Since the local data bus lines LDB are shared between read data and write data, the number of local data bus lines LDB can be reduced to lower the junction capacitances (loads) of the transistors connected to the local data bus lines LDB. As a result, data input/output time can be reduced for shorter access time. Incidentally, in the present embodiment, two local data bus lines LDB are provided for each bit line BL, /BL instead of reducing the number of local data bus lines LDB. Consequently, at the time of defect analysis, the sequence of the bit lines BL, /BL need not be taken into account regardless of whether the product is a relief product or non-relief product. This facilitates the defect analysis. It is therefore possible to reduce the time necessary for the defect analysis.

In FIG. 3, the leftmost bit line pair BL0, /BL0 is connected to the local data bus lines LDB0 and /LDB0 shown above through the column switch circuits CSW. The next bit line pair BL1, /BL1 is connected to the local data bus lines LDB1 and /LDB1 shown below through the column switch circuits CSW. The next bit line pair BL0, /BL0 is connected to the local data bus lines LDB0 and /LDB0 shown below through the column switch circuits CSW. The rightmost bit line pair BL1, /BL1 is connected to the local data bus lines LDB1 and /LDB1 shown above through the column switch circuits CSW.

The local data bus lines LDB are connected to global data bus lines GDB, respectively, which are laid in the wiring direction of the bit lines BL and /BL. The global data bus lines GDB are connected to the common data bus line CDB shown in FIG. 1 through not-shown read amplifiers and write amplifiers.

Figure 4:
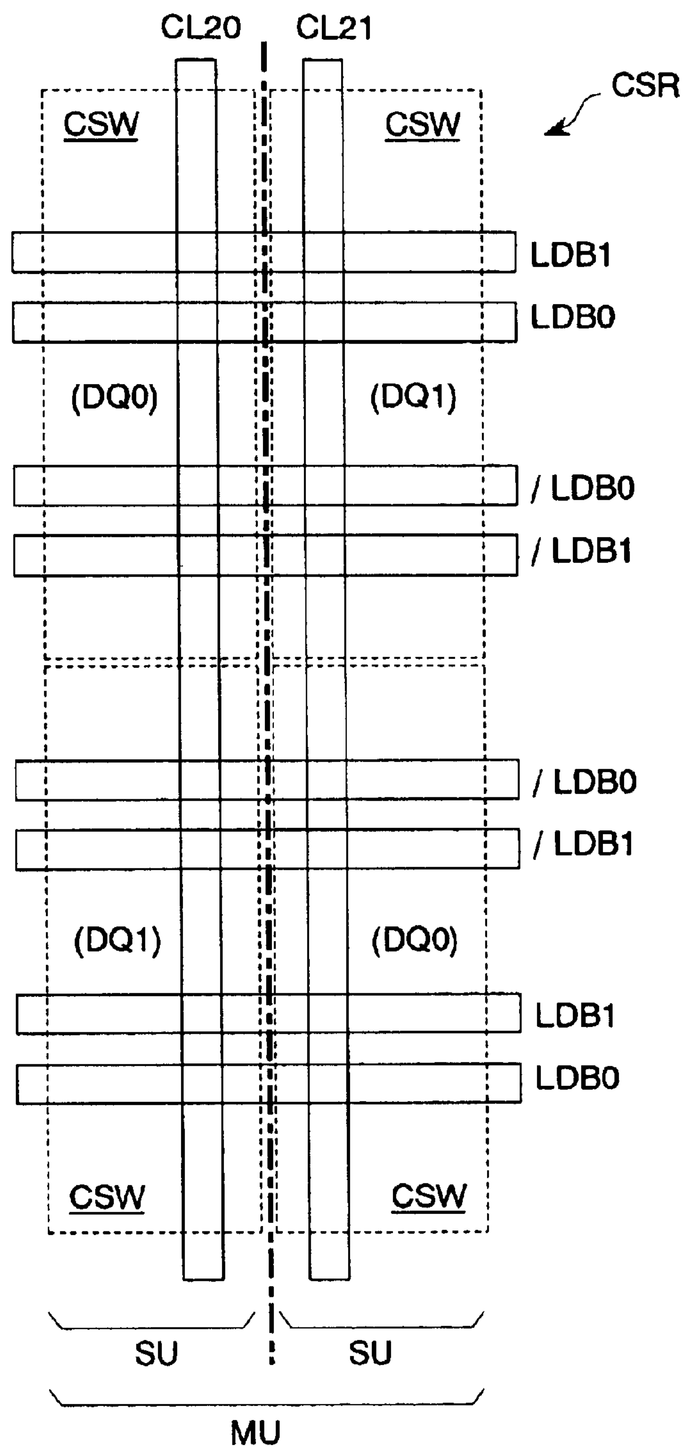
FIG. 4 is a layout diagram showing a column switch area shown in FIGS. 2 and 3.

FIG. 4 shows the column switch area CSR shown in FIGS. 2 and 3.

The column switch circuits CSW aligning from the left in FIG. 3 corresponding to the data terminals DQ0, DQ1, DQ0, and DQ1, respectively, (more properly, the column switch circuit pairs corresponding to the bit line pairs) are laid out on the upper left, the lower left, the lower right, and the upper right in FIG. 4, respectively. That is, in each of the sub memory units SU, the column switch circuits CSW are arranged in a row in the wiring direction of the bit lines BL and /BL.

Besides, in adjoining sub memory units SU within each of the main memory units MU and the redundancy memory unit RU, the column switch circuits CSW are arranged so that the numbers of their corresponding data terminals DQ are in opposite sequences. To put it another way, in the left sub memory unit SU in the diagram, the column switch circuits CSW are arranged such that the numbers of their corresponding data terminals DQ are in the ascending order from the top. In the right sub memory unit SU in the diagram, the column switch circuits CSW are arranged such that the numbers of their corresponding data terminals DQ are in the descending order from the bottom.

In the example shown in FIG. 4, the column switch circuits CSW opposed to each other have different data terminal numbers in the adjoining sub memory units SU. Meanwhile, the local data bus lines LDB are laid in each row of column switch circuits CSW aligning in the direction orthogonal to the wiring direction of the bit lines BL and /BL. This eliminates the need for the local data bus lines LDB to be curved intricately on the column switch areas CSR, thereby facilitating the wiring layout of the local data bus lines LDB.

Figure 5:
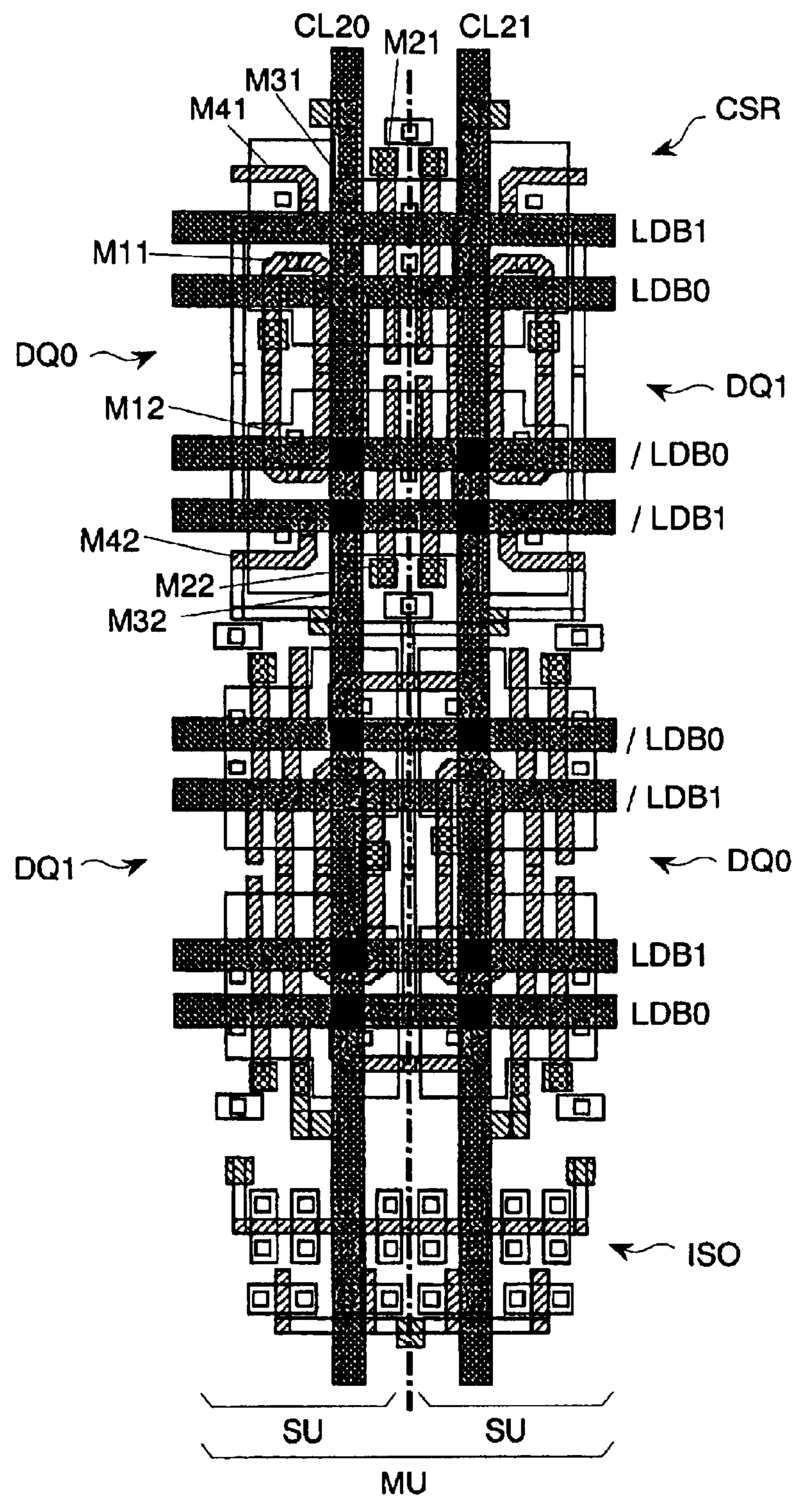
FIG. 5 is a layout diagram showing the arrangement of transistors in the column switch area shown in FIGS. 2 and 3.
Figure 6:
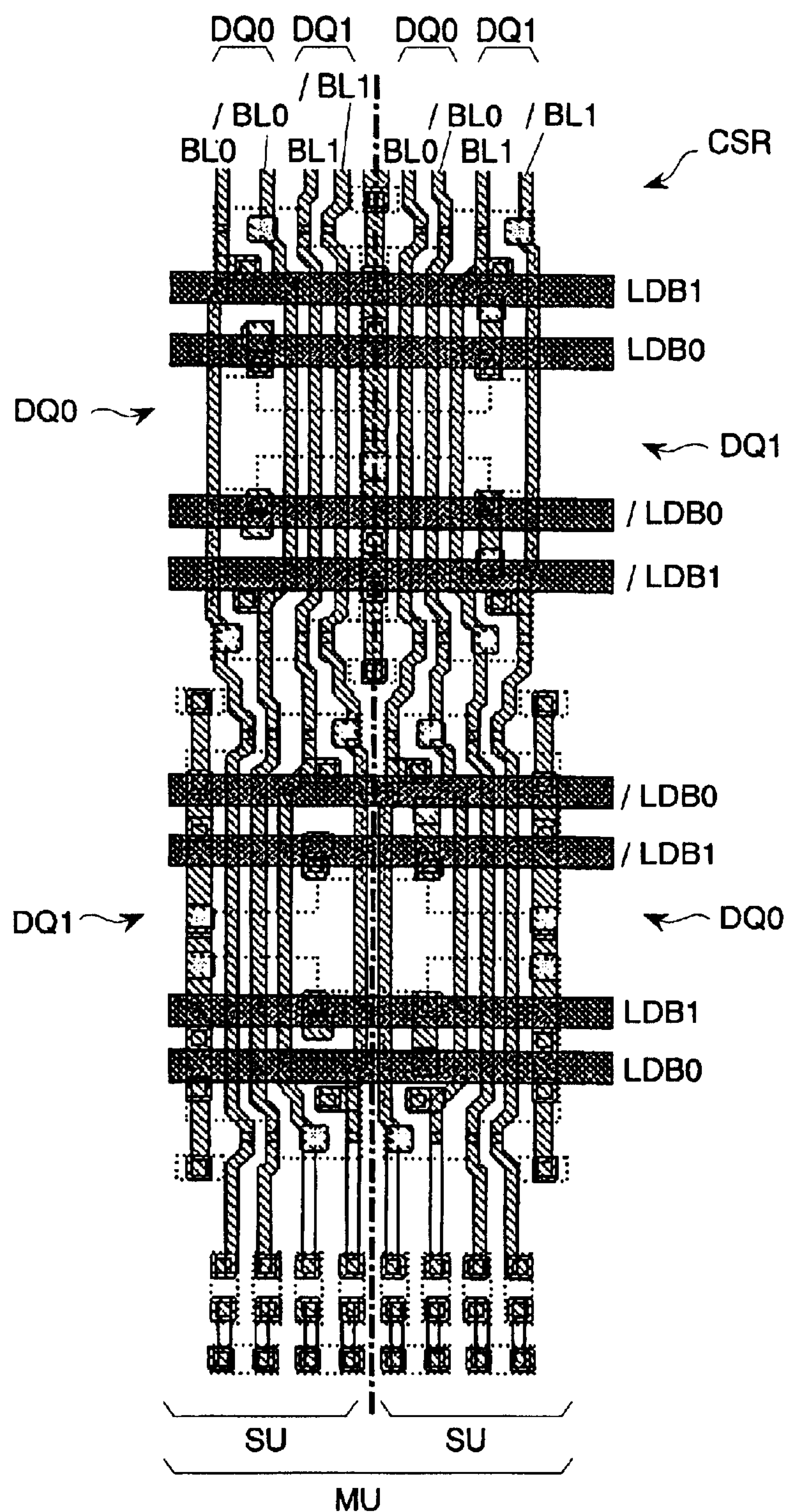
FIG. 6 is a layout diagram showing wiring layers in the column switch area shown in FIGS. 2 and 3.

FIG. 5 shows the arrangement of the transistors in the column switch area shown in FIGS. 2 and 3. FIG. 6 shows the wiring layers in the column switch area shown in FIGS. 2 and 3.

In FIG. 5, the column switch area CSR is formed in mirror symmetry in the wiring direction of the bit lines BL and /BL (the vertical direction in the diagram). Specifically, in the column switch area CSR, the transistors are formed in mirror symmetry about the dashed line in the diagram.

The source regions (ground regions) of the second transistors M21 and M22 shown in FIG. 3 are formed on the dashed line. Because of the formation in the mirror symmetry, the ground regions can be shared between the column switch circuits CSW on the right and left in the diagram. This allows a reduction in the layout size of the column switch area CSR.

In the main memory units MU, the column switch circuits CSW are arranged alternately as mentioned above. The local data bus lines LDB are laid in each row of column switch circuits CSW aligning horizontally in the diagram. The column switch areas CSR are arranged in mirror symmetry about the wiring direction of the bit lines BL and /BL. Consequently, in the column switch areas CSR, the sequence of the bit lines BL and /BL (DQ0, DQ1, DQ0, and DQ1 from the left in FIG. 6) in the case of relief where the redundancy memory unit RU is used can be easily made the same as in the case of non-relief where the redundancy memory unit RU is not used. As a result, at the time of defect analysis, the sequence of the numbers of the bit lines BL, /BL need not be taken into account regardless of whether the product is a relief product or non-relief product. This facilitates the defect analysis.

As has been described, according to the present embodiment, in the main memory units MU, the column switch areas CSR each included in two sub memory units SU are formed in mirror symmetry about the wiring direction of the bit lines BL and /BL. The column switch circuits CSW of adjoining sub memory units in each of the main memory units MU and the redundancy memory unit RU are associated with the data terminals DQ which are differently numbered. Consequently, the sequence of the numbers of the data terminals DQ for the bit lines BL and /BL in the case of relief where the redundancy memory unit RU is used can be made the same as in the case of non-relief where the redundancy memory unit RU is not used. As a result, at the time of defect analysis, the sequence of the bit lines BL, /BL need not be taken into account regardless of whether the product is a relief product or non-relief product. This allows easy defect analysis. It is therefore possible to reduce the time necessary for the defect analysis.

A plurality of groups of local data bus lines LDB are laid in the column switch areas CSR. Hence, the local data bus lines LDB need not be curved intricately on the column switch areas CSR even when the data terminals corresponding to the column switch circuits CSW aligning in the direction orthogonal to the wiring direction of the bit lines BL and /BL have different numbers from each other. This facilitates the wiring layout of the local data bus lines LDB. Besides, the wiring area of the local data bus lines LDB can be minimized.

Since the local data bus lines LDB are shared between read data and write data, the number of local data bus lines LDB laid in the column switch areas CSR can be reduced. As a result, a plurality of groups of local data bus lines LDB can be easily laid in the column switch areas CSR. While a plurality of groups of local data bus lines LDB are laid in the column switch areas CSR with facility, the layout area of the local data bus lines LDB can be minimized to avoid an increase in the chip size of the pseudo SRAM.

Moreover, the present invention is applicable to a pseudo SRAM having column switch circuits CSW of direct sense system or a pseudo SRAM of shift redundancy system.

The embodiment described above has dealt with the case where the present invention is applied to a pseudo SRAM. However, the present invention is not limited to such an embodiment. For example, the invention may be applied to a DRAM or an SRAM.

The foregoing embodiment has dealt with the case where each of the sub memory units SU is provided with the bit lines BL0, /BL0, BL1, and /BL1 and the column switch circuits CSW corresponding to the two data terminals DQ0 and DQ1. However, the present invention is not limited to such an embodiment. For example, each sub memory unit SU may be provided with bit lines BL0, /BL0, BL1, /BL1, BL2, /BL2, BL3, and /BL3 and column switch circuits CSW corresponding to four data terminals DQ0–DQ3.

The invention is not limited to the above embodiments and various modifications may be made without departing from the spirit and scope of the invention. Any improvement may be made in part or all of the components.

What is claimed is:

1. A semiconductor memory comprising:

a plurality of sub memory units each having a plurality of bit lines connected to memory cells, said bit lines corresponding to different data terminals with numbers, said sub memory units being arranged in a direction orthogonal to a wiring direction of said bit lines, a plurality of sense amplifiers connected to said bit lines, and a plurality of column switch circuits connecting said bit lines to data bus lines, respectively;

a plurality of main memory units each comprising an even number of said sub memory units having different addresses from each other and comprising a defective sub memory unit;

a redundancy memory unit having at least one of said sub memory units, and being enabled when said defective sub memory unit is disabled; and column switch areas formed in said main memory units, and having said column switch circuits arranged therein, wherein every two of said column switch areas are formed in mirror symmetry in the wiring direction of said bit lines, and for each of said data terminals, the data bus lines having a same logic are wired in said main memory units and said redundancy memory unit.

2. The semiconductor memory according to claim 1, wherein:

in each of said sub memory units, said column switch circuits are arranged in a row in the wiring direction of said bit lines, the column switch circuits corresponding to said data terminals, and in adjoining ones of said sub memory units in each of said main memory units, said column switch circuits are arranged where sequences of the numbers of said corresponding data terminals are opposite to each other.

3. The semiconductor memory according to claim 2, wherein said data bus lines are wired along each row of said column switch circuits aligning in the direction orthogonal to the wiring direction of said bit lines.

4. The semiconductor memory according to claim 1, wherein said column switch circuits each comprises:

a first transistor with a first drain connected to any one of said data bus lines, and receiving a column selecting signal at a first gate, the column selecting signal being selected in accordance with an address, and a second transistor with a second gate connected to any one of said bit lines and a second drain electrically connected to a source of said first transistor during a read operation.

5. The semiconductor memory according to claim 1, wherein said data bus lines transfers read data read from said memory cells and write data to be written to said memory cells.

6. The semiconductor memory according to claim 5, wherein said column switch circuits each comprises:

a first transistor comprises a first drain, a first gate, and a first source, where said first drain is connected to any one of said data bus lines, and said first transistor receives a column selecting signal at said first gate, the column selecting signal being selected in accordance with an address, a second transistor comprising a second drain, a second gate, and a second source, where said second gate is connected to said bit lines and said second source is connected to a source power supply, a third transistor comprising a third drain, a third gate, and a third source, where said third drain is connected to said first source and said third source is connected to said second drain, and receives read control signal at said third gate, the read control signal turning to an activation level during a read operation, and a fourth transistor comprising a fourth drain, a fourth gate, and a fourth source, where said fourth drain is connected to said bit lines and said fourth source connected to said first source, and receiving a write control signal at said fourth gate, the write control signal turning to said activation level during a write operation.

7. The semiconductor memory according to claim 1, further comprising:

a plurality of first column selecting lines transmitting a plurality of bits of column selecting signals to said sub memory units, the plurality of column selecting signals being selected in accordance with said addresses to turn-on said column switch circuits;

second column selecting lines formed in said sub memory units of said main memory units and of said redundancy memory unit, and connected to said column switch circuits;

a defect information memory part storing defect information therein, the defect information indicating said defective sub memory unit; and a redundancy switch part connecting said first column selecting lines to said second column selecting lines, and being switched according to contents stored in said defect information memory part corresponding to disconnecting said first column selecting lines from a defective second column selecting line of said defective sub memory units, and to connecting said first column selecting lines to normal second column selecting lines, of said sub memory units in said main memory units and of said sub memory unit in said redundancy memory unit, the sub memory units in said main memory units operating normally.

8. The semiconductor memory according to claim 1, wherein:

each of said bit lines is either one of complementary bit line pairs, each of said data bus lines is either one of complementary data bus line pairs, said sense amplifiers are shared among said bit line pairs, and each of said column switch areas comprises said column switch circuits corresponding to said bit line pairs.

* * * * *

UNITED STATES PATENT AND TRADEMARK OFFICE

CERTIFICATE OF CORRECTION

PATENT NO. : 6,831,870 B2
DATED : December 14, 2004
INVENTOR(S) : Toru Koga

It is certified that error appears in the above-identified patent and that said Letters Patent is hereby corrected as shown below:

Column 11,
Line 25, change "comprises" to -- comprising --.

Column 12,
Line 26, change "units" to -- unit --.

Signed and Sealed this

Third Day of May, 2005

JON W. DUDAS
*Director of the United States Patent and Trademark Office*